(12) United States Patent
Matsuda et al.

(10) Patent No.: US 6,281,032 B1
(45) Date of Patent: Aug. 28, 2001

(54) MANUFACTURING METHOD FOR NITRIDE III-V COMPOUND SEMICONDUCTOR DEVICE USING BONDING

(75) Inventors: Osamu Matsuda; Toshimasa Kobayashi; Norikazu Nakayama; Hiroji Kawai, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/291,016

(22) Filed: Apr. 14, 1999

(30) Foreign Application Priority Data

Apr. 22, 1998 (JP) .................................................. 10-112569

(51) Int. Cl.[7] .................................................. H01L 21/00
(52) U.S. Cl. ................................................................ 438/42
(58) Field of Search ................................. 438/107, 108, 438/455, 456, 458, 459

(56) References Cited

U.S. PATENT DOCUMENTS 5,376,580 * 12/1994 Kish et al. .

* cited by examiner

Primary Examiner—Keith Christianson
(74) Attorney, Agent, or Firm—Sonnenschein, Nath & Rosenthal

(57) ABSTRACT

In a semiconductor device manufacturing method capable of manufacturing semiconductor lasers, light emitting diodes or electron transport devices using nitride III-V compound semiconductors with a high productivity, a GaN semiconductor laser wafer is prepared in which a plurality of semiconductor lasers are formed on an AlGaInN semiconductor layer on a c-face sapphire substrate and separated from each other by grooves deep enough to reach the c-face sapphire substrate, and a p-side electrode and an n-side electrode are formed in each semiconductor laser. The GaN semiconductor laser wafer is bonded to a photo-diode built-in Si wafer having formed a photo diode for monitoring light outputs and solder electrodes in each pellet by positioning the p-side electrode and the n-side electrode in alignment with the solder electrodes, respectively. After that, by lapping the c-face sapphire substrate from its bottom surface deep enough to reach the grooves or by dicing the c-face sapphire substrate from its bottom surface, the semiconductor lasers on the photo-diode built-in Si wafer are separated from each other. After that, the photo-diode built-in Si wafer is divided by dicing into discrete pellets. A GaN semiconductor laser chip, thus obtained, is assembled on a package.

16 Claims, 16 Drawing Sheets

MANUFACTURING METHOD FOR NITRIDE III-V COMPOUND SEMICONDUCTOR DEVICE USING BONDING

RELATED APPLICATION DATA

The present application claims priority to Japanese Application No. P10-112569 filed Apr. 22, 1998 which application is incorporated herein by reference to the extent permitted by law.

BACKGROUND OF THE INVENTION

1. Field of the Invention

This invention relates to a semiconductor device and its manufacturing method especially suitable for application to semiconductor lasers, light emitting diodes or electron mobility devices using nitride III-V compound semiconductors.

2. Description of the Related Art

GaN semiconductors are direct transition semiconductors having forbidden band widths ranging from 1.9 eV to 6.2 eV and enabling realization of light emitting devices capable of emitting light over a wide range from the visible region to the ultraviolet region. For these properties, they have become of interest recently, and are placed under active developments. Additionally, GaN semiconductors have a large possibility as material of electron transport devices. Saturation electron velocity of GaN is approximately $2.5 \times 10^7$ cm/s, which is larger than those of GaAs and SiC, and its breakdown electric field is as large as approximately $5 \times 10^6$ V/cm next to the intensity of diamond. For these reasons, GaN semiconductors have been expected to be greatly hopeful as materials of electron transport devices for high frequencies, high temperatures and high power.

There is a semiconductor laser called LOP (laser on photo diode) in which a laser chip is mounted on a sub mount having formed a photo diode for monitoring light output. LOP is packaged in the following manner.

As shown in FIG. 1A, first made is a Sn solder layer (not shown) on a surface of a Si substrate 101 having formed light output monitoring photo diodes (not shown) in individual pellets by vacuum evaporation, for example. Next, as shown in FIG. 1B, the Si substrate 101 is half-cut between individual pellets by dicing. Next, as shown in FIG. 1C, separately prepared laser chips 102 are mounted on respective pellets on the Si substrate 101 in a predetermined positional relation therewith. After that, by heating the Si substrate 101, the Sn solder layer formed thereon is welded to the bottom surface of the laser chips 102. Then, after the Si substrate 101 is fully cut between respective pellets, here again by dicing, it is pulled and broken into chips. As a result, a LOP chip 103 as shown in FIG. 1D is obtained. The LOP chip 103 is thereafter mounted on a heat sink of a package, not shown. Further, a cap with a window is applied onto the package to seal it. Thus, assembling is completed.

The conventional method of semiconductor lasers explained above was certainly more rationalized than methods relying on individually welding each laser chip. However, it was not a so-called batch process, but still needed a number of steps for assembling. Therefore, its productivity was not satisfactory. This problem also lies when manufacturing a semiconductor laser using GaN semiconductors.

OBJECTS AND SUMMARY OF THE INVENTION

It is therefore an object of the invention to provide a semiconductor device manufacturing method capable of manufacturing devices using nitride III-V compound semiconductors, such as semiconductor lasers or light emitting diodes, and electron transport devices like FET, with a high productivity, and provide a semiconductor device made by the manufacturing method.

According to the invention, there is provided a method for manufacturing a semiconductor device comprising the steps of:

bonding a surface of a nitride III-V compound semiconductor layer of a first substrate to one of major surfaces of a second substrate, the first substrate having the nitride III-V compound semiconductor layer on one of major surfaces thereof to form a plurality of devices; and dividing the first substrate and the second substrate bonded together into a plurality of portions.

According to the invention, there is further provided a method for manufacturing a semiconductor device comprising the steps of:

bonding a surface of a nitride III-V compound semiconductor layer of a first substrate to one of major surfaces of a second substrate, the first substrate having the nitride III-V compound semiconductor layer on one of major surfaces thereof to form a plurality of devices separated from each other by grooves deep enough to reach the first substrate, the nitride III-V compound semiconductor layer having on a surface thereof first projections and second projections extending in parallel with the grooves and separated from each other; and dividing the first substrate and the second substrate bonded together into a plurality of portions.

In a typical version of the present invention, the first substrate and the second substrate bonded together are divided into discrete devices on the first substrate. However, the substrates may be divided into units each including two or more devices, if so desired. Division of the substrates is typically effected by dicing these bonded first substrates and second substrates.

In the present invention, a plurality of devices on the first substrate are typically separated from each other by grooves deep enough to reach the first substrate. Typically, the bonded first substrate and second substrate are divided into discrete devices on the first substrate typically by lapping the first substrate from the other major surface thereof at least deep enough to reach the grooves, or by dicing the first substrate from the other major surface thereof at least deep enough to reach the grooves.

In the present invention, electrodes of devices are typically made on the nitride III-V compound semiconductor layer of the first substrate, and solder electrodes are formed on a major surface of the second substrate at positions corresponding to the electrodes of devices. In this case, the first substrate and the second substrate are bonded together by bonding the electrodes of devices on the first substrate to the solder electrodes on the second substrate.

In the present invention, the device made of nitride III-V compound semiconductor layers on the first substrate may be essentially any. Preferably, however, it is of a type made by face-down mounting. More specifically, the device may be a semiconductor laser, light emitting diode or electron transport device such as FET, for example. Formed on the second substrate is any required device.

In the present invention, materials of the first substrate and the second substrate may be chosen as desired. Examples of the material of the first substrate are sapphire substrate, SiC substrate, Si substrate, spinel substrate and ZnO substrate, and so on. Examples of the material of the second substrate are Si substrate, SiC substrate, diamond substrate, AlN substrate, GaN substrate (including those made by growing a GaN layer on a sapphire substrate or any other appropriate substrate), and so on. The first substrate and the second substrate are typically wafer-shaped. However, one or both of the first substrate and the second substrate may be bar-shaped, having a plurality of device structures are aligned in one or more rows. In the case where an electrically insulating substrate is used as the second substrate, wiring from the solder electrodes formed on one major surface thereof may be brought out via through holes made in the second substrate, for example.

According to the invention, there is further provided a method for manufacturing a semiconductor device comprising the steps of:

bonding a surface of a nitride III-V compound semiconductor layer of a first substrate to one of major surfaces of a second substrate, the first substrate having the nitride III-V compound semiconductor layer on one of major surfaces thereof to form a device; and dividing the first substrate and the second substrate bonded together into a plurality of portions.

The projection is typically formed on a side opposite from taller one of the p-side electrode and the n-side electrode with respect to lower one of the p-side electrode and the n-side electrode. The projection is typically approximately equal in height to the lower surface of taller one of the p-side electrode and the n-side electrode.

According to the invention, there is further provided a semiconductor device having a nitride III-V compound semiconductor layer on one of major surfaces of a substrate, and having a p-side electrode and an n-side electrode on the nitride III-V compound semiconductor layer, comprising:

projections made on a surface of the III-V compound semiconductor layer.

In the present invention, nitride III-V compound semiconductors are made of at least one group III elements selected from the group consisting of Ga, Al, In and B and one or more group V elements which include at least N, and may further include As or P, where appropriate. Examples of nitride III-V compound semiconductors are GaN, AlGaN, AlN, GaInN, AlGaInN and InN.

In the semiconductor device manufacturing method having the above mentioned features according to the invention, a large number of devices can be manufactured simultaneously in a full-batch process, by bonding the first substrate previously having a plurality of devices made of nitride compound III-V compound semiconductors to the second substrate, and then dividing the first and second substrates into discrete devices, for example. When first and second projections are made on the surface of the nitride III-V compound semiconductor layers, the first projections or the second projections can be used to prevent the solder from flowing out laterally when the solder is welded to the p-side electrodes or the n-side electrodes, which are lower in height.

In the semiconductor device having the above-mentioned structure according to the invention, it is prevented that the solder flows out laterally when the solder is welded to the p-side electrodes or the n-side electrodes, which are lower in height.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1A:
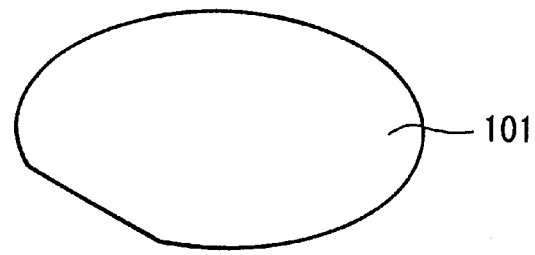
FIGS. 1A through 1D are cross-sectional views for explaining an assembling process of a conventional semiconductor laser package.
Figure 1B:
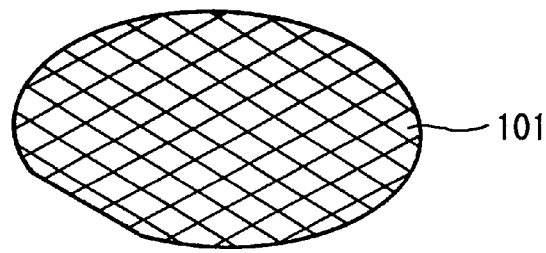
Figure 1C:
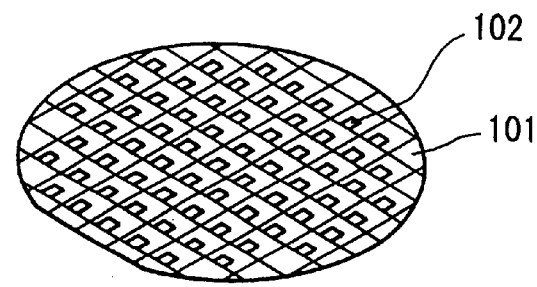
Figure 1D:
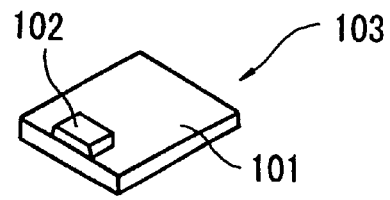

Embodiments of the invention are explained below with reference to the drawings. In all of the drawings illustrating embodiments, identical or equivalent parts or components are labeled with common reference numerals.

First explained is a GaN semiconductor laser manufacturing method according to the first embodiment of the invention. For better and easier understanding, outline of the GaN semiconductor laser manufacturing method is first explained with reference to FIGS. 2 to 6.

Figure 2:
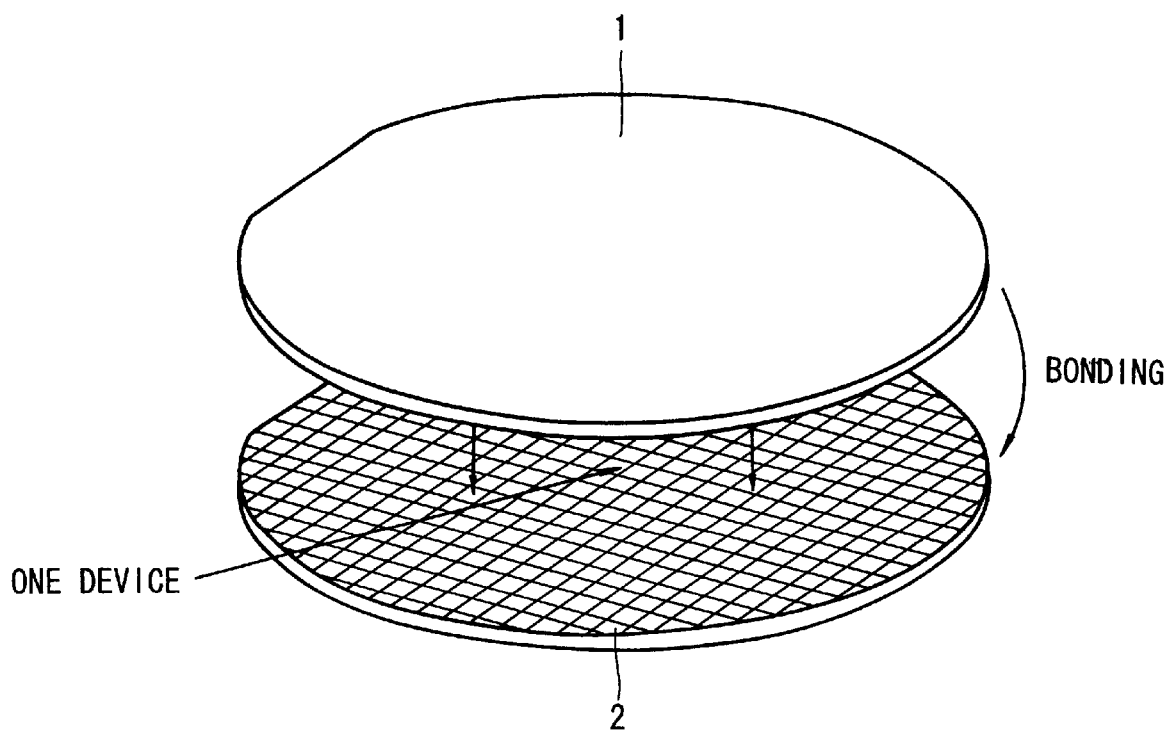
FIG. 2 is perspective view for explaining outline of a GaN semiconductor laser manufacturing method according to the first embodiment of the invention.
Figure 3:
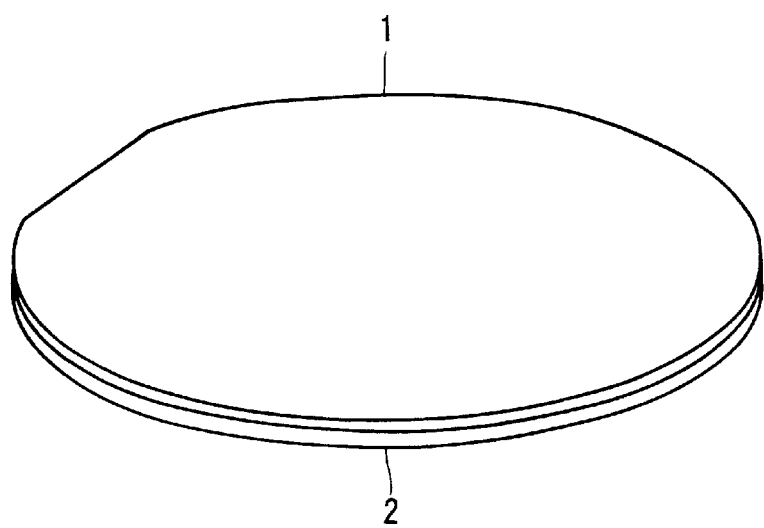
FIG. 3 is a perspective view for explaining outline of the GaN semiconductor laser manufacturing method according to the first embodiment of the invention.

First referring to FIG. 2, GaN semiconductor laser wafer 1 is prepared in which AlGaInN semiconductor layers are grown on a c-face sapphire substrate, laser structures and electrodes (p-side electrodes and n-side electrodes) are built in the AlGaInN semiconductor layers, and grooves are cut in between individual devices from one surface of the AlGaInN semiconductor layers deep enough to reach the c-face sapphire substrate; and a photo-diode built-in Si wafer 2 is prepared which includes light output monitoring photo diodes and solder electrodes in each pellet. Then, as shown in FIG. 3, one surface of the GaN semiconductor laser wafer 1 where the AlGaInN semiconductor layer appears is bonded to one surface of the photo-diode built-in Si wafer 2 where the photo diodes appear. In this process, since the c-face sapphire substrate is transparent, by using the electrodes on the GaN semiconductor laser wafer 1 as an alignment mask, the electrodes on the GaN semiconductor laser wafer 1 and the solder electrodes on the photo-diode built-in Si wafer 2 can be brought into accurate positional alignment. After that, the solder electrodes on the photo-diode built-in Si wafer 2 are welded to the electrodes on the GaN semiconductor laser wafer 1.

Figure 4:
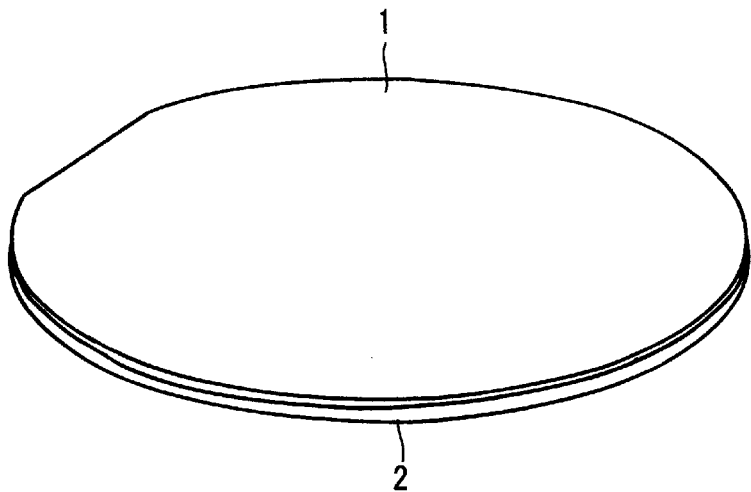
FIG. 4 is a perspective view for explaining outline of the GaN semiconductor laser manufacturing method according to the first embodiment of the invention.
Figure 5:
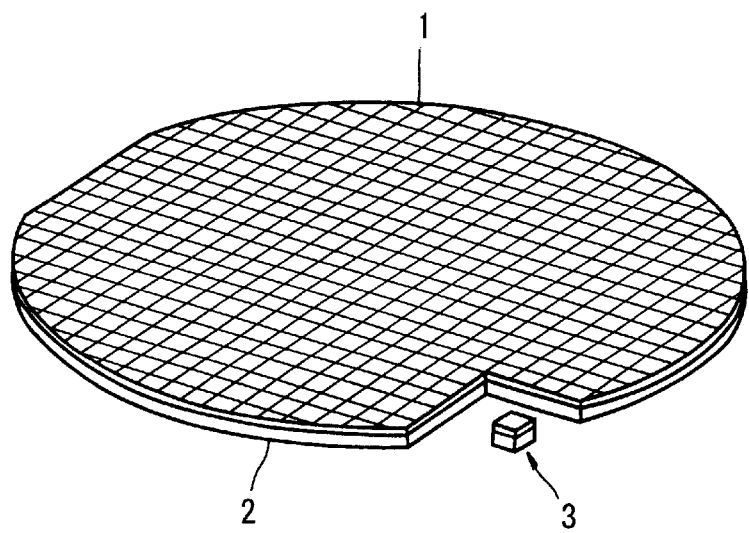
FIG. 5 is a perspective view for explaining outline of the GaN semiconductor laser manufacturing method according to the first embodiment of the invention.

Next, after the c-face sapphire substrate is lapped from its bottom surface to reach the grooves as shown in FIG. 4, a GaN semiconductor laser chip 3 is cut out by dicing as shown in FIG. 5.

Figure 6:
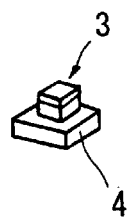
FIG. 6 is a perspective view for explaining outline of the GaN semiconductor laser manufacturing method according to the first embodiment of the invention.

Next, as shown in FIG. 6, the GaN semiconductor laser chip 3 is mounted on a heat sink 4 of a package, and a cap is applied to seal it. Thus, assembly of the GaN semiconductor laser is completed.

Next explained is the GaN semiconductor laser manufacturing method according to the first embodiment of the invention in detail with reference to FIGS. 7 through 15.

Figure 7:
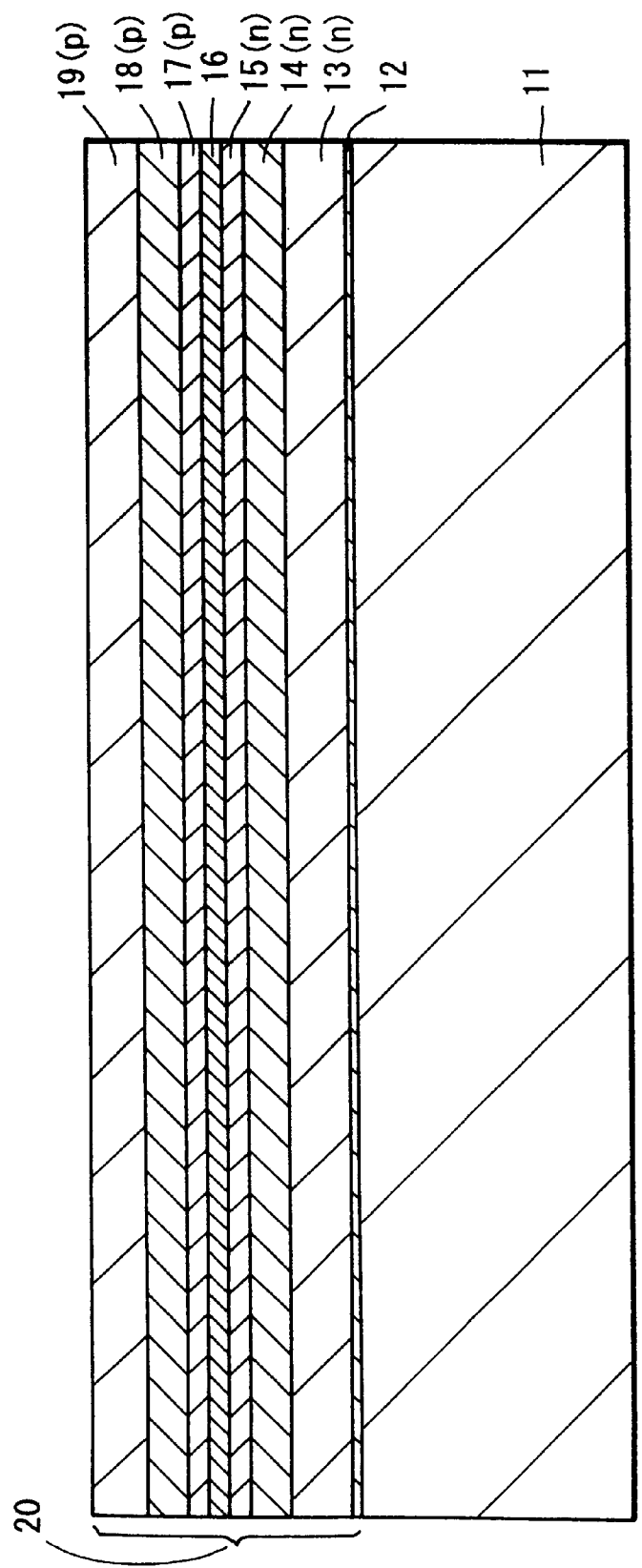
FIG. 7 is a cross-sectional view for explaining details of the GaN semiconductor laser manufacturing method according to the first embodiment of the invention.
Figure 8:
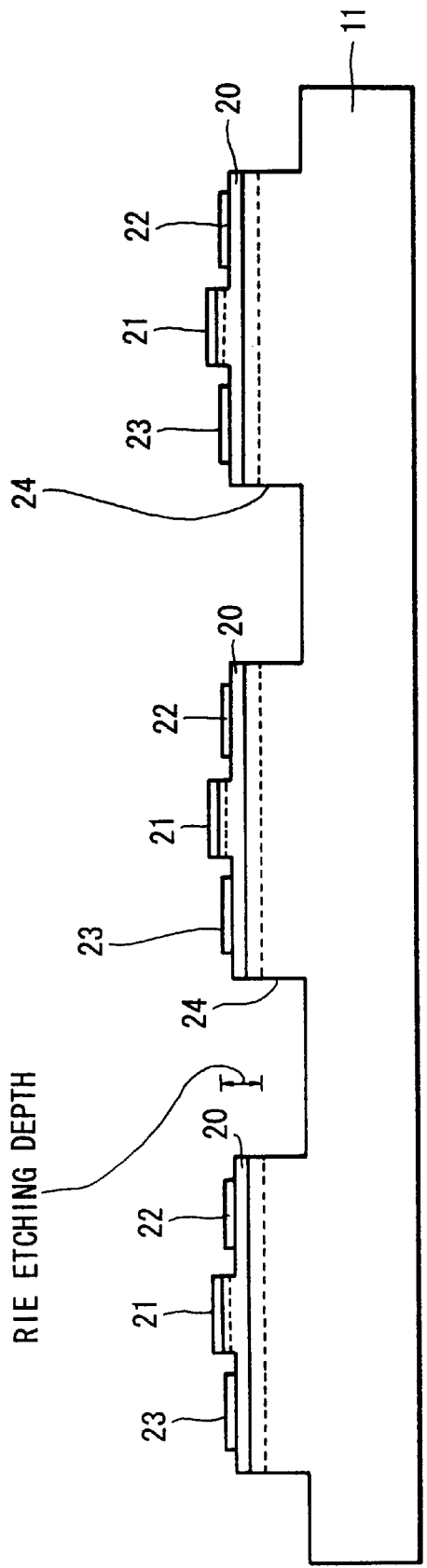
FIG. 8 is a cross-sectional view for explaining details of the GaN semiconductor laser manufacturing method according to the first embodiment of the invention.

First, as shown in FIG. 7, a GaN buffer layer 12 is grown on a c-face sapphire substrate 11 by metal organic chemical vapor deposition (MOCVD) at the growth temperature of approximately 560° C., for example. After that, sequentially grown on the GaN buffer layer 12 are an n-type GaN contact layer 13, n-type AlGaN cladding layer 14, n-type GaN optical guide layer 15, active layer 15 of a $Ga_{1-x}In_xN/Ga_{1-y}In_yN$ multi quantum well structure, p-type GaN optical guide layer 17, p-type AlGaN cladding layer 18 and p-type GaN contact layer 19 by MOCVD. In the explanation hereinafter made, these layers are collectively referred to as AlGaInN semiconductor layer 20, where more appropriate. Growth temperature is approximately 1000° C., for example, for growth of layers not containing In, namely, n-type GaN contact layer 13, n-type AlGaN cladding layer 14, n-type GaN optical guide layer 17, p-type AlGaN cladding layer 18 and p-type GaN contact layer 19, and 700° C. through 800° C., for example, for growth of the layer containing In, namely, active layer 16 having a $Ga_{1-x}In_xN/Ga_{1-y}In_yN$ multi quantum well structure. Examples of thicknesses of these layers are 3 μm of the n-type GaN contact layer 13, 0.5 μm of the n-type AlGaN cladding layer 14, 0.1 μm of the n-type GaN optical guide layer 15, 0.1 μm of the p-type GaN optical guide layer 16, 0.5 μm of the p-type cladding layer 18, and 0.5 μm of the p-type GaN contact layer 19. The n-type GaN contact layer 13, n-type AlGaN cladding layer 14 and n-type GaN optical guide layer 15 are doped with Si, for example, as their donor whereas the p-type GaN optical guide layer 17, p-type AlGaN cladding layer 18 and p-type GaN contact layer 19 are doped with Mg, for example, as their acceptor. There follows annealing for electric activation of donors and acceptors doped into these layers, particularly, for activation of acceptors doped into the p-type GaN optical guide layer 17, p-type AlGaN cladding layer 18 and p-type GaN contact layer 19. The annealing temperature is approximately 700° C., for example.

Thereafter, a stripe-shaped resist pattern of a predetermined width, extending normally to the cavity lengthwise direction of the semiconductor laser, is formed on the AlGaInN semiconductor layer 20. Using the resist pattern (not shown) as a mask, next conducted is reactive ion etching (RIE), for example, deep enough to slightly etch the c-face sapphire substrate 1. As a result, the AlGaInN semiconductor layer 20 has formed laser facets in form of etched facets (see FIG. 7).

After that, a stripe-shaped resist pattern (not shown) with a predetermined width, extending in the cavity lengthwise direction, is made on the AlGaInN semiconductor layer 20 in each location for the semiconductor laser. Using the resist pattern as a mask, the AlGaInN semiconductor layer 20 is etched by RIE, for example, deep enough to reach a half depth of the n-type GaN contact layer 13. As a result, a stripe portion is formed.

After that, in each location for the semiconductor laser, a p-side electrode 21 in form of a Ni/Au film or Ni/Pt/Au film, for example, is formed on the p-type GaN contact layer 19 of the AlGaInN semiconductor layer 20. At the same time, an n-side electrode 22 and a dummy n-side electrode 23 in form of Ti/Al/TiAg film or TiAl/TiPtAu film, for example, is formed on the n-type GaN contact layer 13 in the etched regions at opposite sides of the stripe portion.

Thereafter, grooves 24 are made between respective semiconductor lasers on the GaN semiconductor laser wafer obtained by processes explained above by dicing from the side of the AlGaInN semiconductor layer 20 deep enough to reach a half depth of the c-face sapphire substrate 1.

Figure 9:
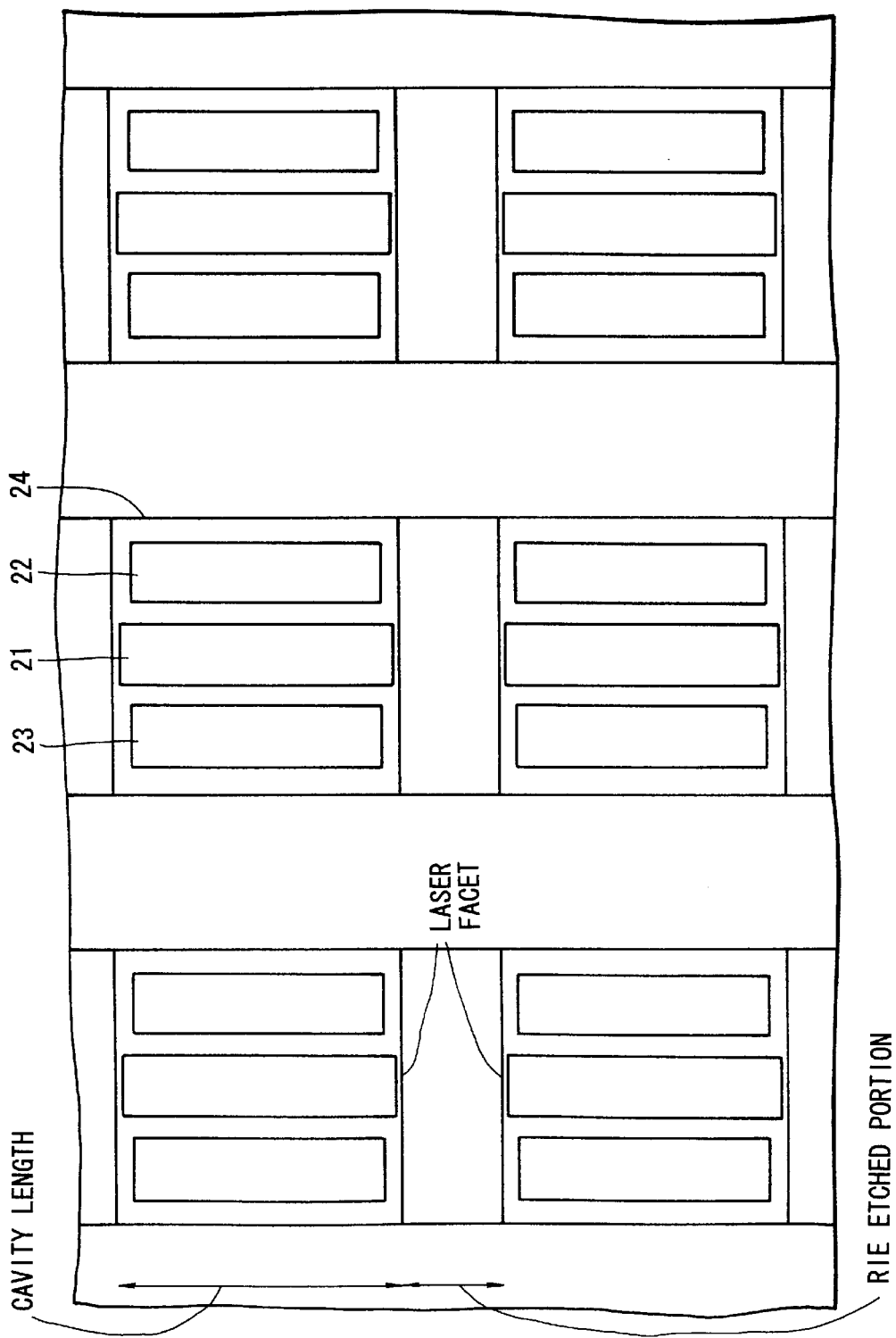
FIG. 9 is a plan view corresponding to FIG. 7.

The GaN semiconductor laser wafer afer the above-explained processes is shown in FIG. 9 in a plan view.

Figure 10:
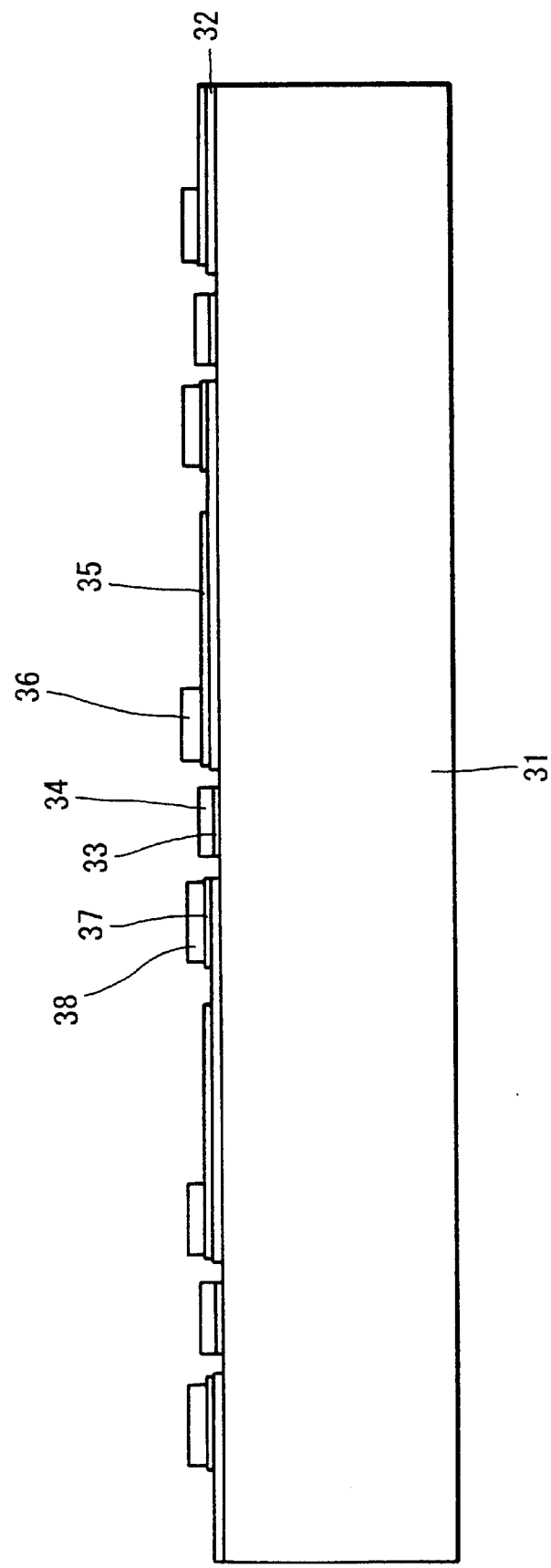
FIG. 10 is a cross-sectional view for explaining details of the GaN semiconductor laser manufacturing method according to the first embodiment of the invention.
Figure 11:
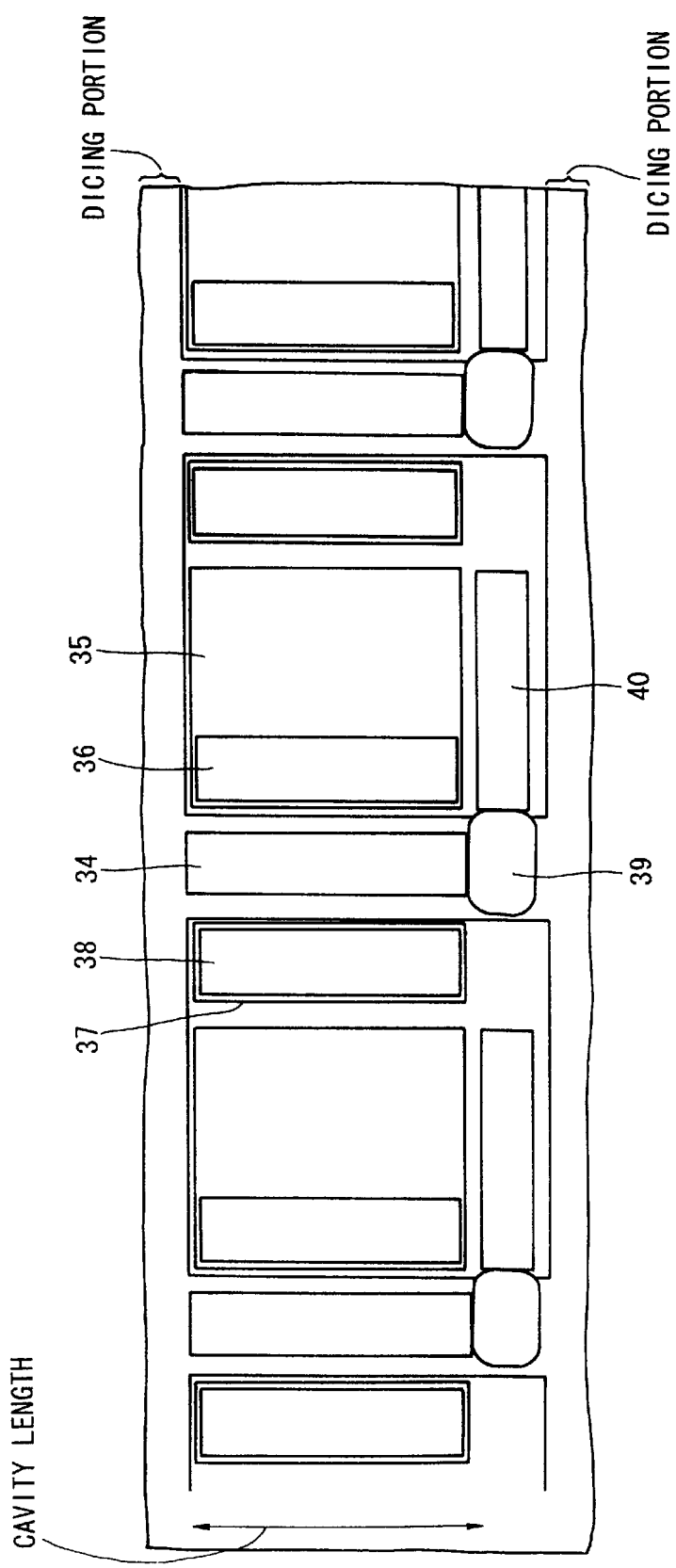
FIG. 11 is a plan view corresponding to FIG. 10.

On the other hand, separately prepared is a Si substrate 31 having formed, among others, photo diodes, such as pin photo diodes (not shown), and solder electrodes, as shown in FIG. 10. More specifically, the Si substrate 31 is prepared by epitaxially growing an i-type Si layer on an n⁺-type Si substrate and forming a p-type layer on the i-type Si layer to make up pin photo diodes. As shown in FIG. 10, a $SiO_2$ film 32 is formed on the surface of the Si substrate 31. The $SiO_2$ film 32 has stripe-shaped apertures slightly wider than the p-side electrode 21. In the apertures, a Sn solder layer 34 is formed on the Si substrate 31 via ohmic electrodes 33. The ohmic electrodes are brought into ohmic contact with an n⁺-type layer (not shown) formed on the surface of the Si substrate 31. In one of apertures, an Al pad electrode 35 of a predetermined shape is made on the $SiO_2$ film 32, and a Sn solder layer 36 is formed on a portion of the Al pad electrode 35 via a Ti film and a Ag film (both not shown). In the other of the apertures, a dummy Al electrode 37 of a predetermined configuration is formed on the $SiO_2$ film 32, and a Sn solder layer 38 is formed thereon via a Ti film and a Ag film, both not shown. These Sn solder layers 34, 36 and 38 have the same pattern and positional relation as those of the p-side electrode 21, n-side electrode 22 and dummy n-side electrode 23 on the GaN semiconductor laser wafer already explained above. The difference in height of the Sn solder layers 36, 38 from the Sn solder layer 34 is equal to the difference in height of the p-side electrode 21 from the n-side electrode 22 and the dummy n-side electrode 23 on the GaN semiconductor laser wafer. The Si substrate 31 is shown in FIG. 11 in a plan view. In FIG. 11, reference numeral 39 denotes a pin photo diode portion, and 40 denotes an Al pad electrode connected to the pin photo diode portion through a contact hole, not shown.

Figure 12:
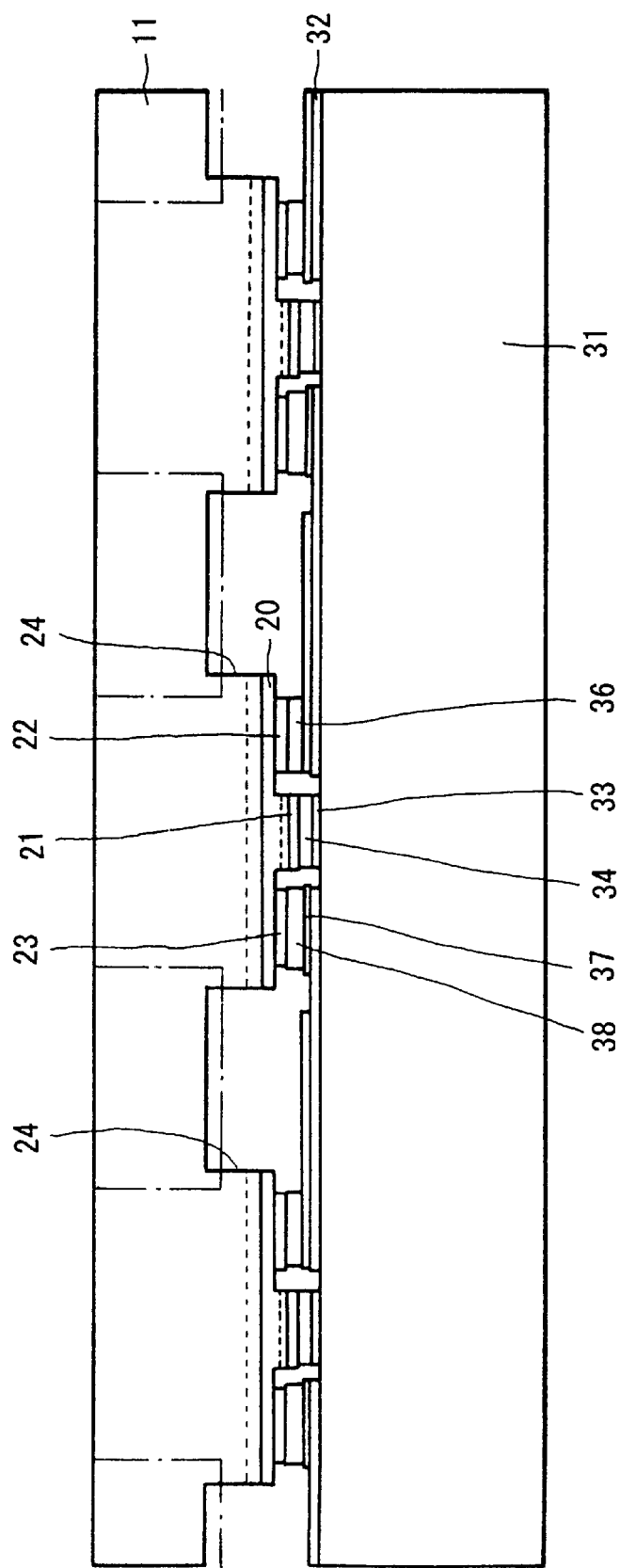
FIG. 12 is a cross-sectional view for explaining details of the GaN semiconductor laser manufacturing method according to the first embodiment of the invention.

Next, as shown in FIG. 12, the GaN semiconductor laser wafer is put on the photo-diode built-in Si wafer, orienting the major surface having the AlGaInN semiconductor layer 20 of the former toward the latter and positioning the p-side electrode 21, n-side electrode 22 and dummy n-side electrode 23 of the former substrate in alignment with the solder layers 34, 36 and 37 of the Si substrate 31, and they are bonded together. In this process, since the difference in height of the Si solder layers 36, 38 from the Sn solder layer 34 is equal to the difference in height of the p-side electrode 21 from the n-side electrode 22 and the dummy n-side electrode 23, the p-side electrode 21, n-side electrode 22 and dummy n-side electrode 23 can be brought into contact with the Sn solder layers 34, 36 and 37, respectively, while holding the GaN semiconductor laser wafer and the photo-diode built-in Si wafer in parallel with each other. In this state, the GaN semiconductor laser wafer and the photo-diode built-in Si wafer are heated to approximately 300° C., for example, to melt and weld Sn solder layers 34, 36 and 37 to the p-side electrode 21, n-side electrode 22 and dummy n-side electrode 23, respectively.

Figure 13:
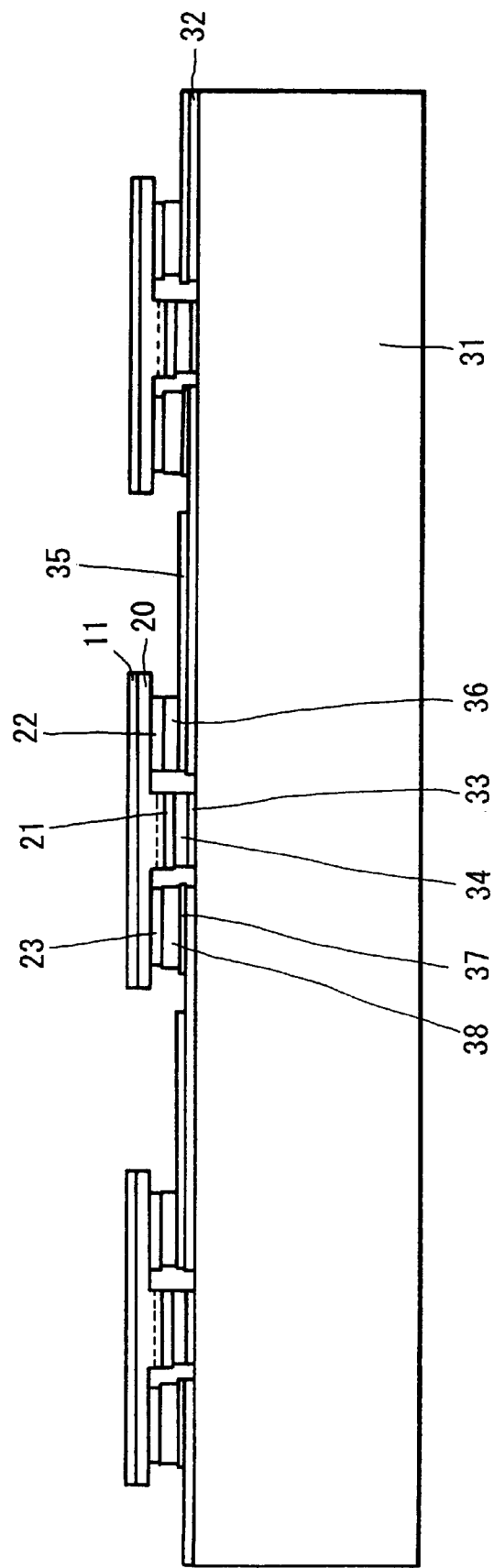
FIG. 13 is a cross-sectional view for explaining details of the GaN semiconductor laser manufacturing method according to the first embodiment of the invention.

After that, the c-face sapphire substrate 11 is lapped from its bottom surface at least deep enough to reach the grooves 24. That is, lapping is done to maintain only a slight thickness of the c-face sapphire substrate 11. As a result, as shown in FIG. 13, the structure holding GaN semiconductor lasers separated from each other on the Si substrate 31 is obtained.

Figure 14:
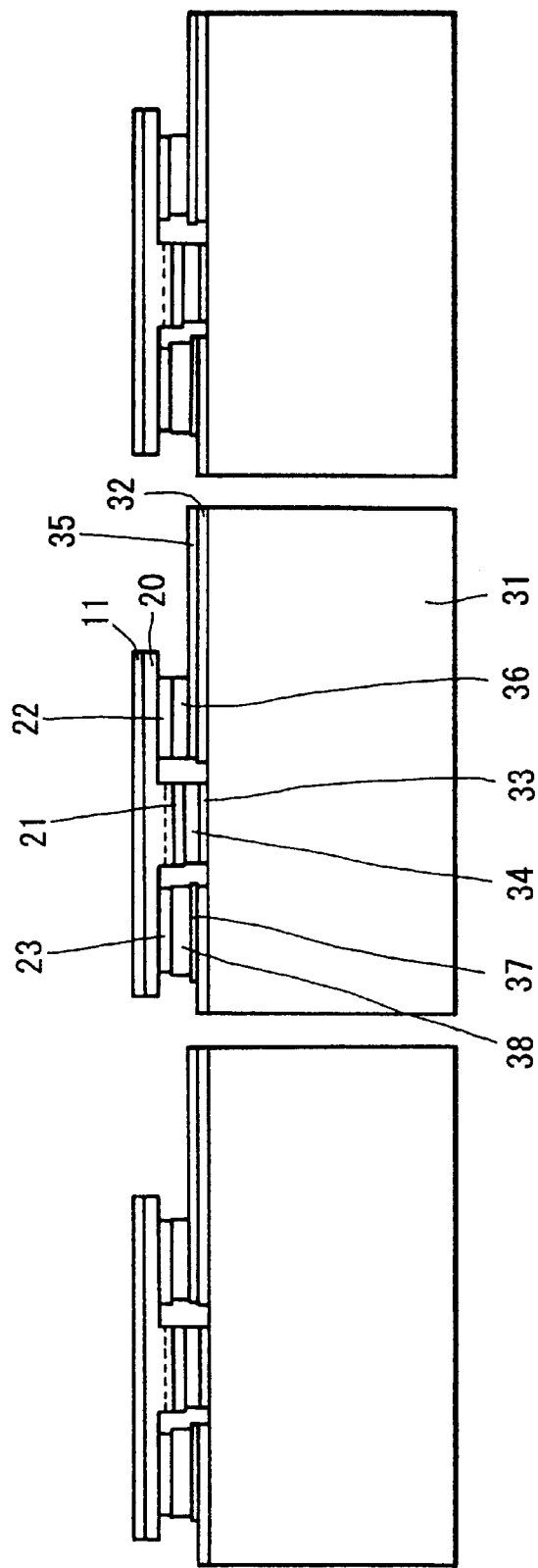
FIG. 14 is a cross-sectional view for explaining details of the GaN semiconductor laser manufacturing method according to the first embodiment of the invention.

Next, as shown in FIG. 14, the Si substrate 1 is fully cut into discrete semiconductor lasers by dicing. As a result, LOP having a GaN semiconductor laser chip mounted on the Si substrate 31 with the built-in pin photo diode is obtained.

Figure 15:
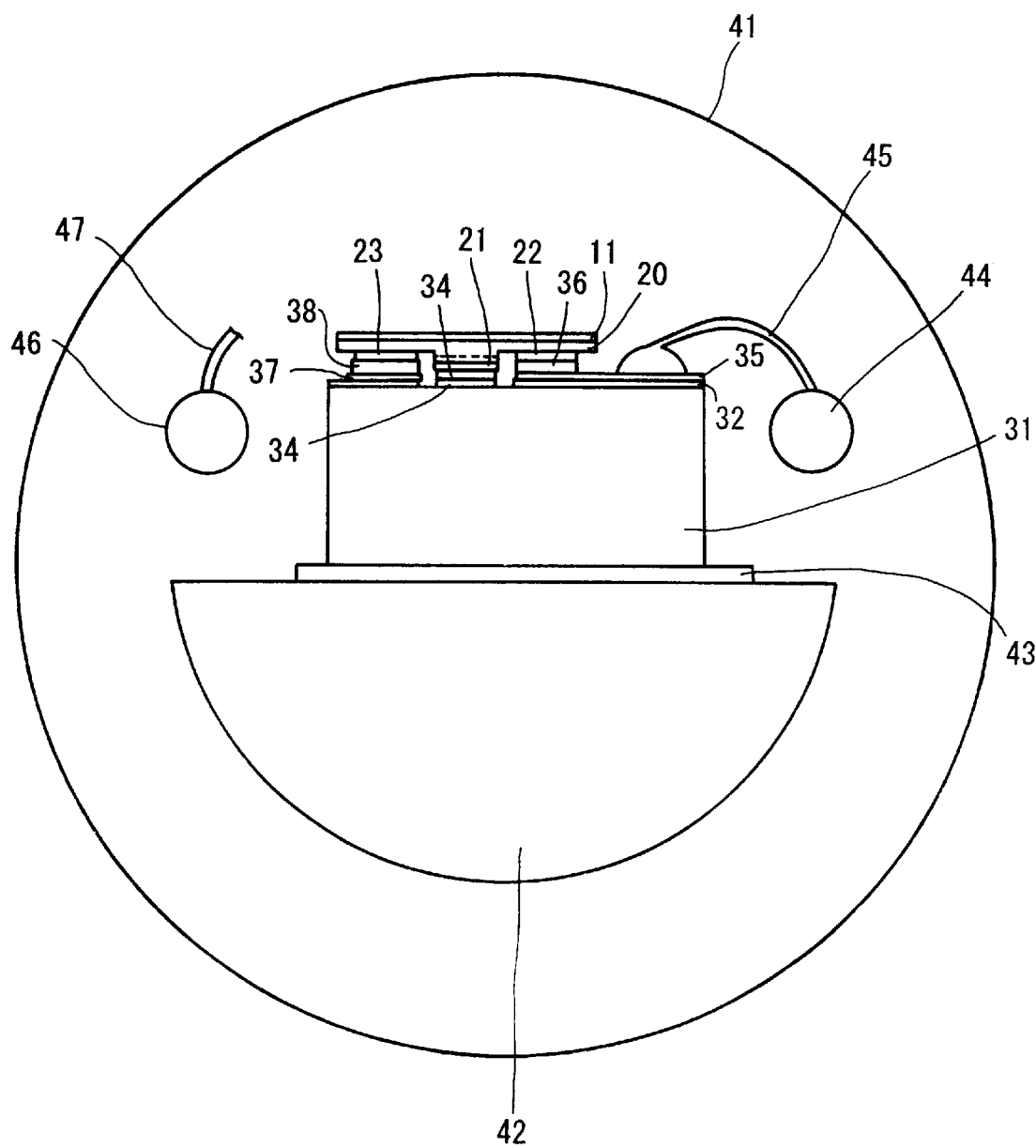
FIG. 15 is a cross-sectional view for explaining details of the GaN semiconductor laser manufacturing method according to the first embodiment of the invention.

After that, as shown in FIG. 15, LOP is mounted on a heat sink 42 of a predetermined package 41 via a Ag paste layer 43, for example, orienting the side of the Si substrate 31 of LOP be in contact with the heat sink 42. Thereafter, the Al pad electrode 35 on the Si substrate 31 is bonded to an electrode lead 44 with a wire 45, and the Al pad electrode 40 (not shown in FIG. 14) is bonded to an electrode lead 46 with a wire 47. Then, a cap having a window (not shown) is applied to seal it.

After these steps, the intended GaN semiconductor laser is completed.

As explained above, according to the first embodiment, the GaN semiconductor laser wafer is prepared by a number of laser structures and electrodes on the AlGaInN semiconductor layer 20 on the c-face sapphire substrate and making grooves 24 deep enough to reach the c-face sapphire substrate 11 so as to separate individual semiconductor lasers whereas the photo-diode built-in Si wafer is prepared by previously making photo diodes and solder electrodes thereon; then the surface of the GaN semiconductor laser wafer where the AlGaInN semiconductor layer 20 appears is bonded to the surface of the photo-diode built-in Si wafer where the photo diodes appear; and these bonded GaN semiconductor laser wafer and photo-diode built-in Si wafer are divided by dicing into discrete laser chips. Therefore, a number of GaN semiconductor lasers can be manufactured simultaneously in a full batch process. Thus, the invention can remarkably improves the productivity of GaN semiconductor lasers, and can reduce the manufacturing cost significantly.

Next explained is a GaN semiconductor manufacturing method according to the second embodiment of the invention.

In the second embodiment, GaN semiconductor lasers can be separated by dicing the c-face sapphire substrate 11 from its bottom surface deep enough to reach the grooves 24 as shown by the dot-and-dash line in FIG. 12, instead of lapping the c-face sapphire substrate from its bottom surface like the first embodiment. In the other respect, the second embodiment is the same as the first embodiment, and explanation there of is omitted.

The second embodiment also have the same advantages as those of the first embodiment.

Next explained is a GaN semiconductor laser manufacturing method according to the third embodiment of the invention.

Figure 16:
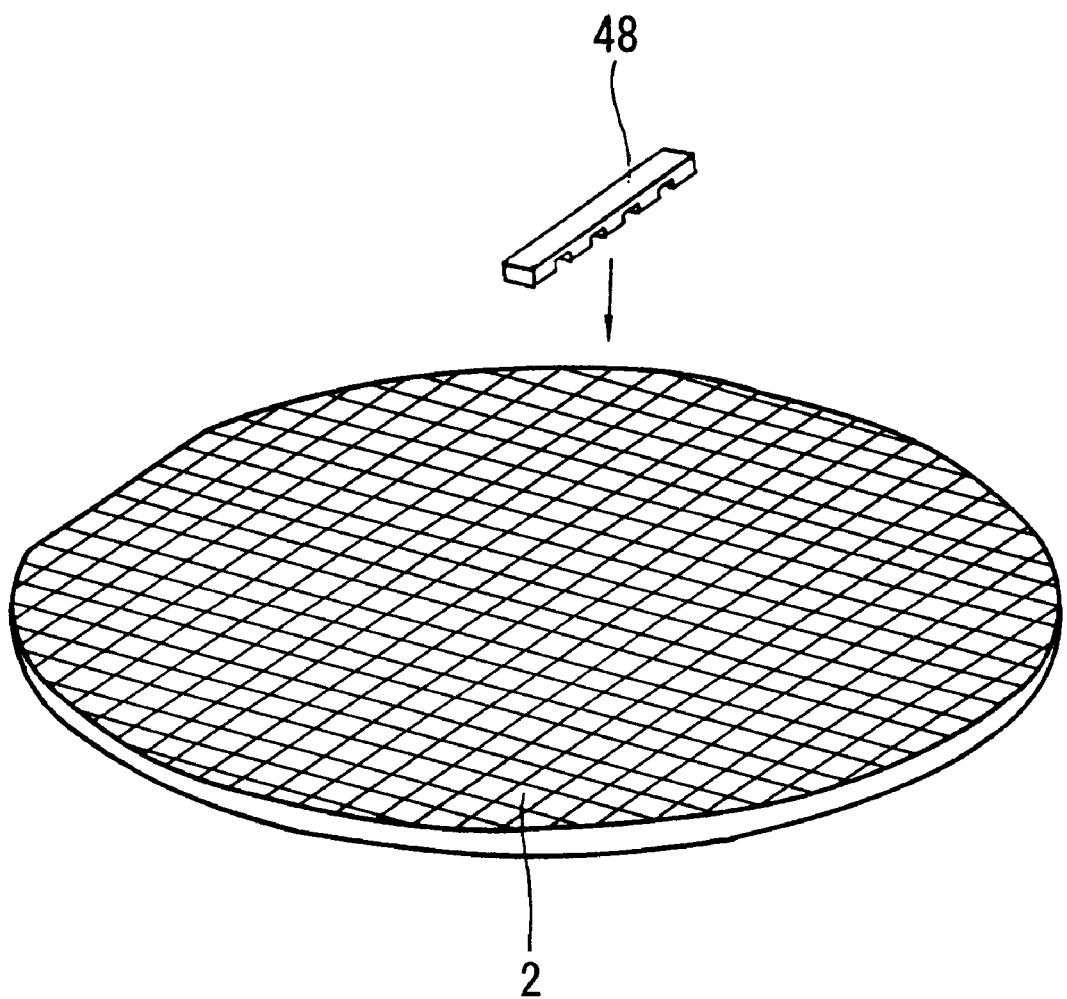
FIG. 16 is a cross-sectional view for explaining a GaN semiconductor laser manufacturing method according to the third embodiment of the invention.

In the third embodiment, instead of bonding the GaN semiconductor laser wafer to the photo-diode built-in Si wafer like the first embodiment, a GaN semiconductor laser bar 48 having a predetermined number of built-in laser structures is spread over the photo-diode built-in Si wafer as shown in FIG. 16, and they are bonded in the same manner as the first embodiment. In the other respect, the third embodiment is the same as the first embodiment, and explanation thereof is omitted.

The third embodiment also ensures the same advantages as those of the first embodiment.

Next explained is a GaN semiconductor laser manufacturing method according to the fourth embodiment of the invention.

Figure 17:
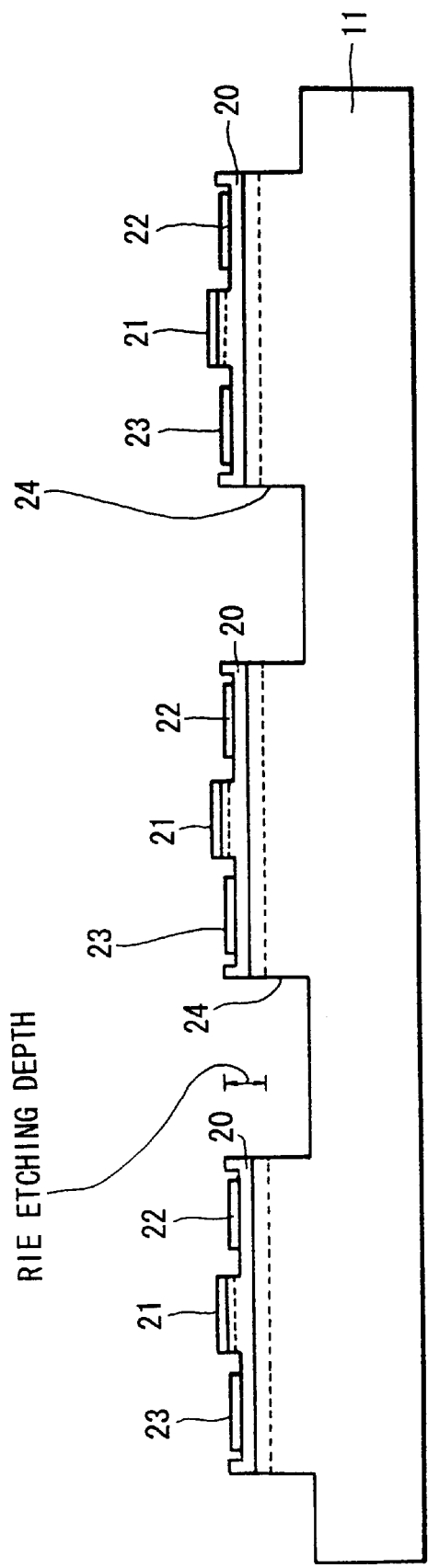
FIG. 17 is a cross-sectional view for explaining a GaN semiconductor laser manufacturing method according to the fourth embodiment of the invention.

In the fourth embodiment, as shown in FIG. 17, projections equal in height to the level of the contact surface of the p-side electrode 21 are made at opposite ends of the AlGaInN semiconductor layer 20 of the GaN semiconductor laser wafer in the direction normal to the cavity lengthwise direction. The projections prevent the solder of the Sn solder layers 36, 38 from flowing out when the GaN semiconductor laser wafer is bonded to the photo-diode built-in Si wafer and the Sn solder layers 34, 36 and 38 are melted and welded.

The fourth embodiment also ensures the same advantages as those of the first embodiment.

Next explained is a GaN semiconductor laser manufacturing method according to the fifth embodiment of the invention.

Figure 18:
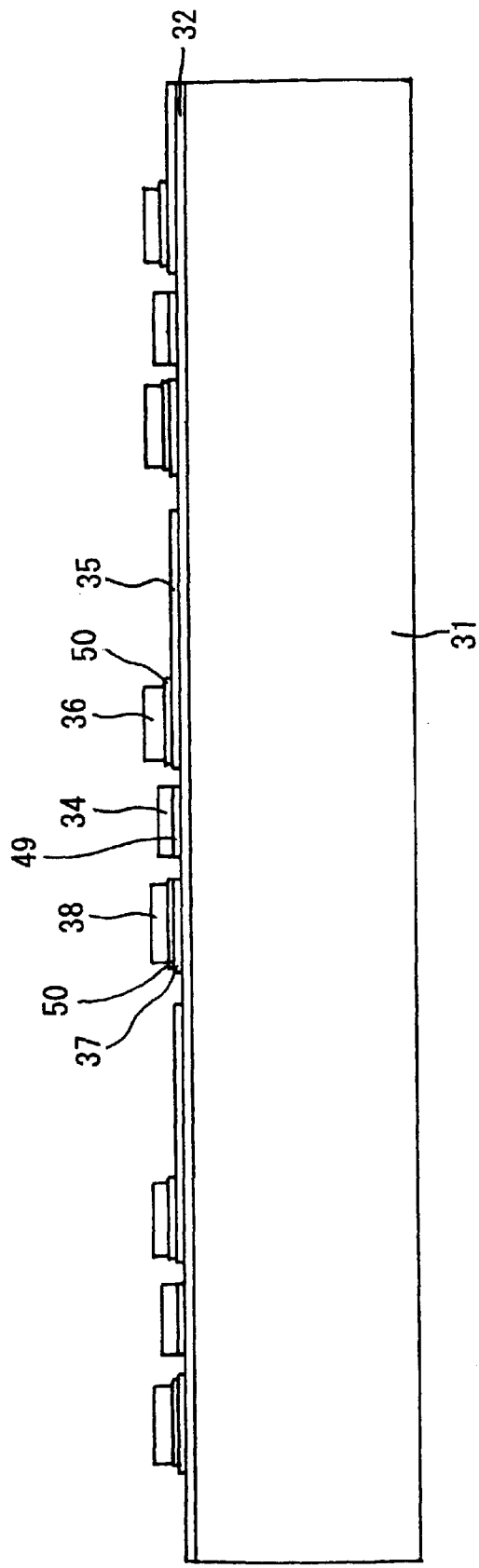
FIG. 18 is a cross-sectional view for explaining a GaN semiconductor laser manufacturing method according to the fifth embodiment of the invention.

In the fifth embodiment, as shown in FIG. 18, an Al electrode 49, Al pad electrode 35 and dummy Al electrode 37 are formed on the $SiO_2$ film 32 made on the Si substrate 31. The Al electrode 49 is in ohmic contact with an $n^+$-type layer formed on the surface of the Si substrate 31 via a contact hole, not shown, and the Sn solder layer 34 is made on the Al electrode 49. The Sn solder layer 36 is formed on the Al pad electrode 35 via a Ti/Ag film 50. Similarly, the Sn solder layer 38 is formed on the dummy Al electrode 37 via the Ti/Ag film 50. In this case, thickness of the Ti/Ag film 50, i.e., the difference in height of the Sn solder layers 36 and 38 from the Sn solder layer 34, is equal to the different in height of the p-side electrode 21 from the n-side electrode 22 and the dummy n-side electrode 23 on the GaN semiconductor laser wafer. In the other respect, the fifth embodiment is the same as the first embodiment, and explanation thereof is omitted.

The fifth embodiment also ensures the same advantages as those of the first embodiment.

Next explained is a GaN semiconductor laser manufacturing method according to the sixth embodiment of the invention.

Figure 19:
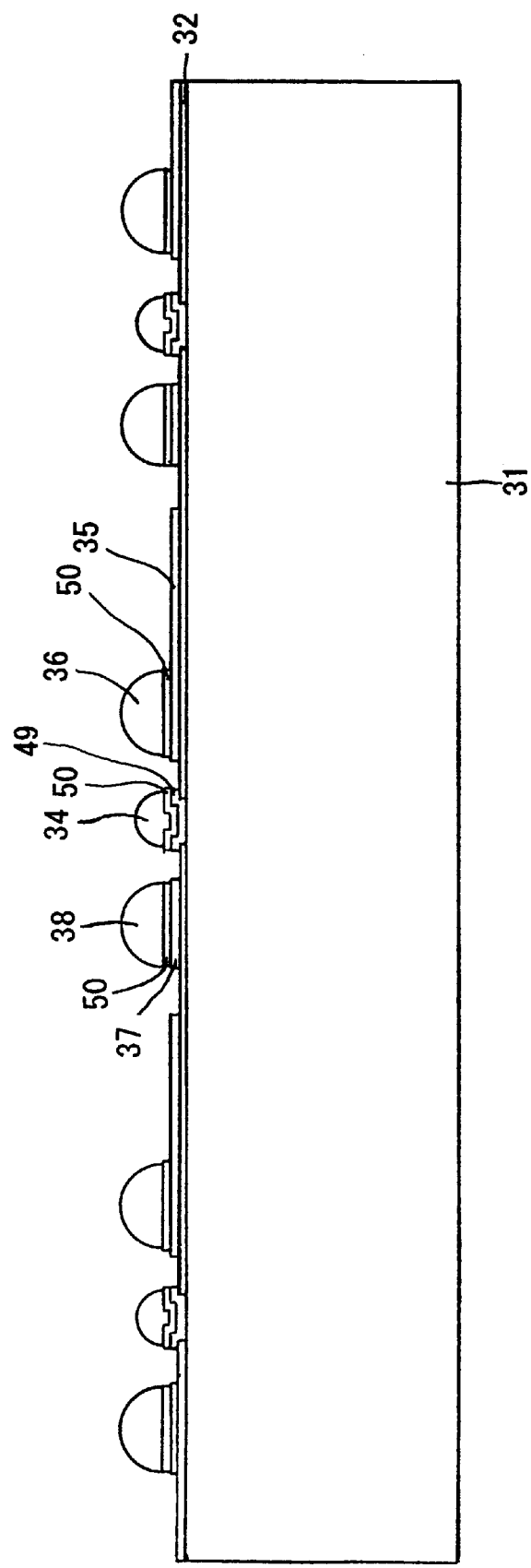
FIG. 19 is a cross-sectional view for explaining a GaN semiconductor laser manufacturing method according to the sixth embodiment of the invention.

In the sixth embodiment, as shown in FIG. 19, the $SiO_2$ film 32 made on the Si substrate 31 has formed openings 32a. In the portion of each opening 32a, a semi-spherical Sn solder layer 34 is formed via an Al electrode 49 and a Ti/Ag film 50. On one side of each opening 32a, a semi-spherical Sn solder layer 36 is formed on the SiO₂ film 34 via the Al pad electrode 35 and the Ti/Ag film 50. On the other side of each opening 32a, a semi-spherical Sn solder layer 38 is formed on the SiO₂ film 32 via the dummy Al electrode 37 and the Ti/Ag film 50. In this case, areas of the Ti/Ag film 50 on the Al pad electrode 35 and the dummy Al electrode 37 are sufficiently larger than the area of the Ti/Ag film 50 on the Al electrode 49. Responsively, diameters, i.e. heights, of the semi-spherical Sn solder layers 36, 38 formed on the Al pad electrode 35 and the dummy Al electrode 37 via the Ti/Ag film 50 are sufficiently larger than the diameter, i.e. height, of the semi-spherical Sn solder layer 34 formed on the Al electrode 49 via the Ti/Ag film 50. More specifically, the difference in height of the semi-spherical Sn solder layers 36, 38 from the semi-spherical Sn solder layer 34 is equal to the difference in height of the p-side electrode 21 from the n-side electrode 22 and the dummy n-side electrode on the GaN semiconductor laser wafer. These semi-spherical Sn solder layers 34, 36, 38 can be made by first making Sn layers equal in thickness on full areas of respective portions of the Ti/Ag film 50, and then heating the Si substrate 31 to approximately 300° C. to melt the Sn layers. In the other respect, the sixth embodiment also ensures the same advantages as those of the first embodiment.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values, structures, substrates, soldering materials and processes presented in the first, second and third embodiments are not but examples, and any other appropriate numerical values, structures, substrates, processes, and so on, may be used.

The first embodiment has been explained as making the n-side dummy electrode 23 on the AlGaInN semiconductor layer 20 of the GaN semiconductor laser wafer. However, the n-side dummy electrode 23 may be omitted, if appropriate. In this case, the dummy Al electrode 37 and the Sn solder layer 38 need not be made on the photo-diode built-in Si wafer.

The fourth embodiment has been explained as making projections at opposite ends of the AlGaInN semiconductor layer 20 in the direction normal to the cavity lengthwise direction. However, the projections may be made slightly in-side of these opposite ends.

The sixth embodiment has been explained as previously making the semi-spherical Sn solder layers 34, 36, 38 on the photo-diode built-in Si wafer before it is bonded. However, the semi-spherical Sn solder layers 34, 36 and 38 may be made by forming flat Sn solder layers on respective portions of the Ti/Ag film 50 with the same configurations there with and all with the same thickness, then stacking the photo-diode built-in Si wafer on the GaN semiconductor laser wafer, and thereafter heating them to 300° C.

Although the first to sixth embodiments have been explained as applying the invention to fabrication of GaN semiconductor lasers, the invention is also applicable to fabrication of GaN light emitting diodes or GaN electron transport devices like GaN FET.

As described above, the semiconductor device manufacturing method according to the invention enables simultaneously manufacturing a large number of devices in a full batch process, by bonding the first substrate, previously having formed a plurality of devices made of nitride compound semiconductor layers, to the second substrate, and dividing these bonded first and second substrates. Therefore, semiconductor lasers, light emitting diodes or electron transport devices using nitride III-V compound semiconductors can be manufactured with a high productivity.

Furthermore, in the semiconductor device according to the invention, projections on the surface of the nitride III-V compound semiconductor layer is effectively used to prevent the solder from flowing out laterally while the solder is welded onto taller one of the p-side electrode and the n-side electrode.

What is claimed is:

1. A method for manufacturing a semiconductor device comprising the steps of:
   bonding a surface of a nitride III-V compound semiconductor layer of a first wafer-shaped or bar-shaped substrate to one of major surfaces of a second wafer-shaped or bar-shaped substrate, said first substrate having said nitride III-V compound semiconductor layer on one of major surfaces thereof to form a plurality of devices;
   forming said plurality of devices on said nitride III-V compound semiconductor layer; and
   dividing said first substrate and said second substrate bonded together into a plurality of portions.

2. The method for manufacturing a semiconductor device according to claim 1 wherein said first substrate and said second substrate bonded together are divided into individual devices.

3. The method for manufacturing a semiconductor device according to claim 1 wherein said plurality of devices are separated by grooves deep enough to reach said first substrate.

4. The method for manufacturing a semiconductor device according to claim 1 further comprising the step of lapping said first substrate from the other major surface thereof at least deep enough to reach said grooves.

5. The method for manufacturing a semiconductor device according to claim 4 further comprising the step of dicing said first substrate from the other major surface thereof at least deep enough to reach said grooves.

6. The method for manufacturing a semiconductor device according to claim 1 wherein electrodes of said devices are formed on said nitride III-V compound semiconductor layer of said first substrate, and solder electrodes are formed on said one major surface of said second substrate in locations corresponding to said electrodes of said devices.

7. The method for manufacturing a semiconductor device according to claim 6 wherein said first substrate and said second substrate are bonded together by bonding said electrodes of said devices on said first substrate to said electrodes on said second substrate.

8. The method for manufacturing a semiconductor device according to claim 1 wherein said devices are semiconductor lasers, light emitting diodes or electron transport devices.

9. The method for manufacturing a semiconductor device according to claim 1 wherein said first substrate is a sapphire substrate, SiC substrate, Si substrate, spinel substrate or ZnO substrate.

10. The method for manufacturing a semiconductor device according to claim 1 wherein said second substrate is a Si substrate, SiC substrate, diamond substrate, AlN substrate, GaN substrate, ZnO substrate or spinel substrate.

11. The method for manufacturing a semiconductor device according to claim 1 wherein said devices are semiconductor lasers, and said second substrate is a Si substrate on which photo diodes for monitoring light outputs of said semiconductor lasers are formed for respective devices.

12. A method for manufacturing a semiconductor device comprising the steps of:

bonding a surface of a nitride III-V compound semiconductor layer of a first wafer-shaped or bar-shaped substrate to one of major surfaces of a second wafer-shaped or bar-shaped substrate, said first substrate having said nitride III-V compound semiconductor layer on one of major surfaces thereof to form a plurality of devices separated from each other by grooves deep enough to reach said first substrate, said nitride III-V compound semiconductor layer having on a surface thereof first projections and second projections extending in parallel with said grooves and separated from each other; and dividing said first substrate and said second substrate bonded together into a plurality of portions.

13. A method for manufacturing a semiconductor device comprising the steps of:

bonding a surface of a nitride III-V compound semiconductor layer of a first wafer-shaped or bar-shaped substrate to one of major surfaces of a second wafer-shaped or bar-shaped substrate, said first substrate having said nitride III-V compound semiconductor layer on one of major surfaces thereof to form a device; and dividing said first substrate and said second substrate bonded together into a plurality of portions.

14. A method for manufacturing a semiconductor device comprising the steps of:

preparing a GaN semiconductor laser wafer by:
forming a plurality of semiconductor lasers on an AlGaInN semiconductor layer formed on a top surface of a c-face sapphire substrate, said plurality of semiconductors being separated from each other by grooves formed deep enough into said AlGaInN semiconductor layer to reach said c-face sapphire substrate;

forming a p-side electrode and an n-side electrode in each of said semiconductor lasers;

bonding said GaN semiconductor laser wafer to a photo-diode built-in Si wafer having formed thereon at least a pellet corresponding to each semiconductor laser, each pellet having a photo-diode for monitoring light outputs and at least two solder electrode, by positioning said p-side electrode and said n-side electrode in alignment with said at least two solder electrodes, respectively;

separating from each other said semiconductor lasers on said photo-diode built-in Si wafer by removing said c-face sapphire substrate from a bottom surface deep enough to reach said grooves;

dividing said photo-diode built-in Si wafer by dicing into discrete pellets; and assembling a resulting GaN semiconductor laser chip on a package.

15. The method for manufacturing a semiconductor device as claimed in claim 14, wherein said c-face sapphire substrate is removed from said bottom surface by lapping said c-face sapphire substrate from said bottom surface.

16. The method for manufacturing a semiconductor device as claimed in claim 14, wherein said c-face sapphire substrate is removed from said bottom surface by dicing said c-face sapphire substrate from said bottom surface.

* * * * *